United States Patent [19]

Ziesmer

[11] 4,137,503
[45] Jan. 30, 1979

[54] PHASE SHIFTING APPARATUS

[75] Inventor: Randall A. Ziesmer, Pinellas, Fla.

[73] Assignee: Honeywell Inc., Minneapolis, Minn.

[21] Appl. No.: 829,706

[22] Filed: Sep. 1, 1977

[51] Int. Cl.² .............................................. H03K 5/153
[52] U.S. Cl. ....................................... 328/155; 328/55; 307/232
[58] Field of Search ................... 328/55, 155; 307/232

[56] References Cited
U.S. PATENT DOCUMENTS

| 3,569,842 | 3/1971 | Schroyer | 328/55 |
| 3,714,589 | 1/1973 | Lewis | 328/155 |
| 3,883,810 | 5/1975 | Tacussel | 328/155 |

Primary Examiner—John S. Heyman
Attorney, Agent, or Firm—Theodore F. Neils

[57] ABSTRACT

Apparatus is provided for changing the phase, and possibly the duty cycle, of two amplitude levels, periodic input signal. This is accomplished by providing a phase measuring signal related to the phase point in each period of the input signal.

9 Claims, 2 Drawing Figures

PHASE SHIFTING APPARATUS

The invention herein described is made in the course of, or under, a contract, or subcontract thereunder, with the Department of the Air Force.

BACKGROUND OF THE INVENTION

The present invention relates to controlled phase shifters for shifting the phase of a two amplitude levels, periodic input signal, and particularly, where this input signal is a timing clock signal having a phase to be adjusted by the phase shifter apparatus, usually in a feedback loop.

A voltage controlled phase shifter is often required in feedback loops which are used to control the phase of digital system timing clock signals, or the phase of clock signals appearing in analog systems for use in operating analog switches. One known method for doing so involves converting the two amplitude levels clock signal, i.e. square wave of a selected duty cycle, into a corresponding triangular wave by use of an integrator which receives and integrates the two amplitude levels timing clock signal. The output of the integrator is supplied to a comparator at its non-inverting input while a phase control voltage signal is supplied to the inverting input of the comparator. The output of the comparator is connected to an edge-triggered, D-type flip-flop which has its complementary output connected back to the D input to thereby provide a 50% duty cycle phase controlled output signal. This method of providing a voltage control phase shifter requires an input timing clock signal having twice the frequency of the phase controlled output signal and so is limited to a phase shift maximum of approximately 180° maximum. Further, the integrator circuit can cause inaccuracies.

SUMMARY OF THE INVENTION

A controlled phase shifter is provided, capable of receiving a control input signal and a periodic timing input signal, for controlling the phase of a phase corrected timing signal obtained from the periodic timing input signal. The controlled phase shifter has therein a periodic timing means for receiving the periodic timing input signal and develops therein a phase delay signal which is a measure of the phase point in the current period of the periodic timing input signal. The periodic timing means provides this phase delay signal at an output thereof to a connected comparator means. This comparator means is also capable of receiving the control input signal and will provide an output signal shift at an output thereof whenever the phase delay signal exceeds the control input signal. A duty cycle determination means is connected to the comparator means output for determining the duty cycle of the phase corrected timing signal provided by the controlled phase shifter apparatus.

DESCRIPTION OF THE PREFERRED EMBODIMENTS

Figure 1A:
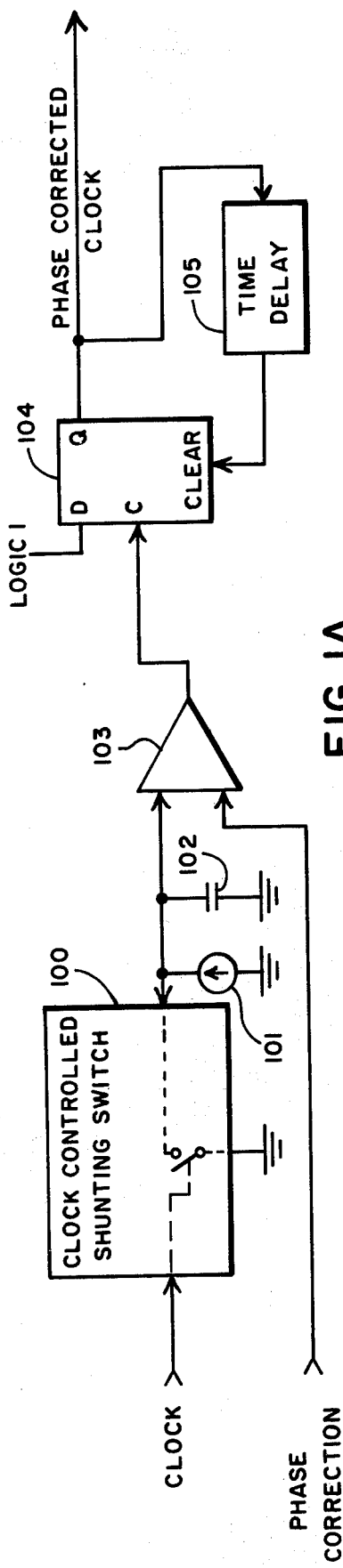
FIG. 1 shows a system diagram of the present invention.

Turning of FIG. 1A, there is shown a system operation diagram for the control phase shifter of the present invention. The output of this system is a signal PHASE CORRECTED CLOCK, while the input signals are the signal CLOCK and the signal PHASE CORRECTION. The PHASE CORRECTION signal is assumed to be a DC voltage which changes slowly with respect to the CLOCK signal.

In FIG. 1A, a clock controlled shunting switch, 100, is connected across the current source, 101, and a capacitor, 102. Current source 101 acts to charge capacitor 102 whenever switch 100 is open; however, when switch 100 closes, capacitor 102 is discharged and the current from current source 101 is shunted to ground.

Figure 1B:
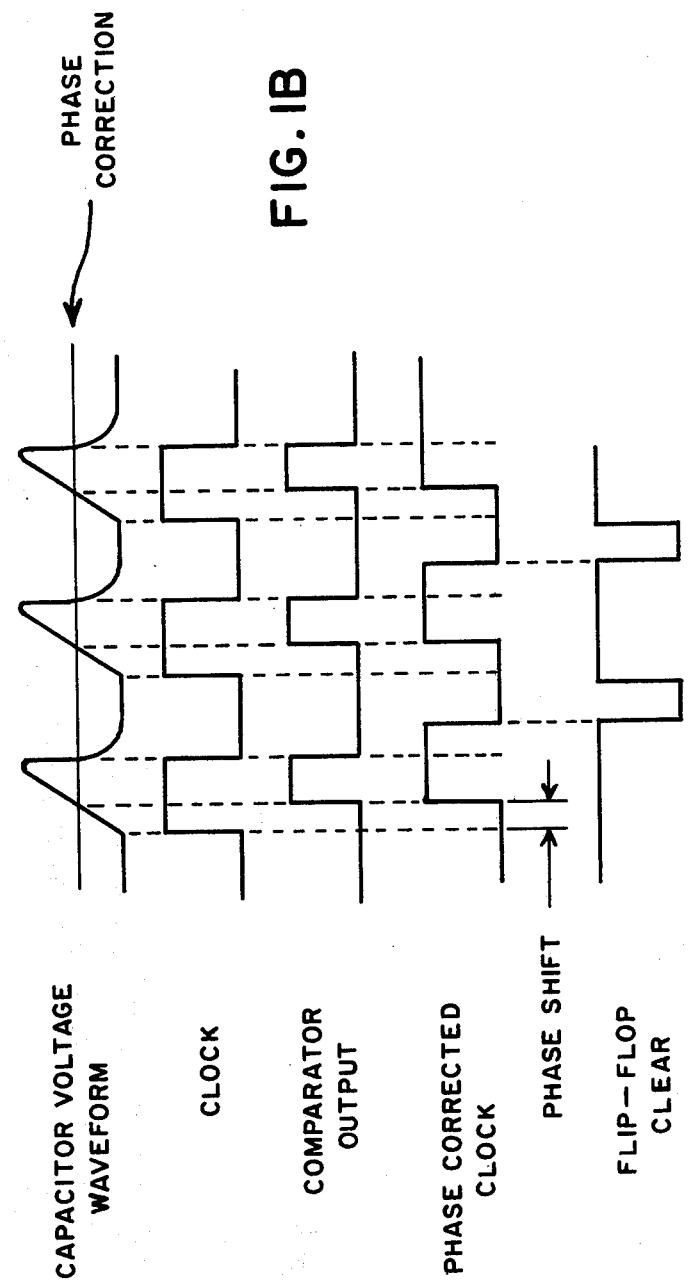

Switch 100 is controlled by the CLOCK timing signal, a sample over time being shown in FIG. 1B. The leading edge of the CLOCK signal opens the shunting switch to permit current source 101 to charge capacitor 102 leading to a voltage waveform across this capacitor which is approximately a linear function of time. The trailing edge of the CLOCK signal closes switch 100 to discharge capacitor 102. A portion of the resulting voltage waveform across capacitor 102 as a function of time is shown in FIG. 1D. Voltage plotted on the ordinate axes in FIG. 1B becomes more positive in the upward direction. This capacitor voltage waveform is the voltage applied to the inverting input of an analog comparator, 103.

The non-inverting input of comparator 103 receives the PHASE CORRECTION signal from a phase correcting source which is often another block in a feedback loop, a loop provided for correcting the phase of the signal CLOCK. As stated above, the slowly changing PHASE CORRECTION signal appears to be a nearly unvarying, direct voltage insofar as the controlled phase shifter system is concerned, and is therefore shown as a horizontal line across the capacitor voltage waveform in FIG. 1B, at an arbitrary level by way of example. When the capacitor voltage waveform rises to the level of this horizontal line, it is just sufficient to cause a signal level shift at the output of comparator 103. A corresponding portion of the output voltage signal of comparator 103 over time is shown in FIG. 1B where there is a dashed line from the leading edge of each comparator output pulse to the corresponding switching point on the capacitor voltage waveform of FIG. 1B. This switch point occurs where the PHASE CORRECTION signal equals, i.e. crosses, the capacitor voltage waveform at its rising or leading edge in each period of the CLOCK signal.

The output signal of comparator 103 is applied to the clock input of a D-type flip-flop, 104. A true logic state signal is continuously applied to the D input of flip-flop 104 so that flip-flop 104 will set its output to the true state every time comparator 103 has an output signal level shift upward. The result at the output of flip-flop 104 is the signal PHASE CORRECTED CLOCK. A portion of this signal over time is shown in FIG. 1B and the resulting phase shift between the CLOCK and the PHASE CORRECTED CLOCK signal is indicated there. Clearly, if the signal PHASE CORRECTION increases and so moves upward on the capacitor voltage waveform shown in FIG. 1B, the phase shift of the leading edge of the signal PHASE CORRECTED CLOCK will increase with respect to the leading edge of the signal CLOCK.

The duty cycle of the PHASE CORRECTED CLOCK signal is controlled by a time delay circuit, 105, in FIG. 1A. The output voltage from time delay circuit 105 clears flip-flop 104 to the low level logic state in preparation for the next cycle in the CLOCK signal. The duty cycle of the signal PHASE CORRECTED CLOCK thus depends on the length of the time delay provided in time delay circuit 105. This time delay can be set by using a selected fixed delay, or it can be set by use of an automatic loop sensing the duty cycle of the signal PHASE CORRECTED CLOCK which can provide some command against which the time delay can adjust to determine the duty cycle in the PHASE CORRECTED CLOCK signal. An automatically controlled delay can have the advantage of continually correcting for variable delays occurring in the circuit in which the sensing occurs due to temperature, aging, etc.

Figure 2:
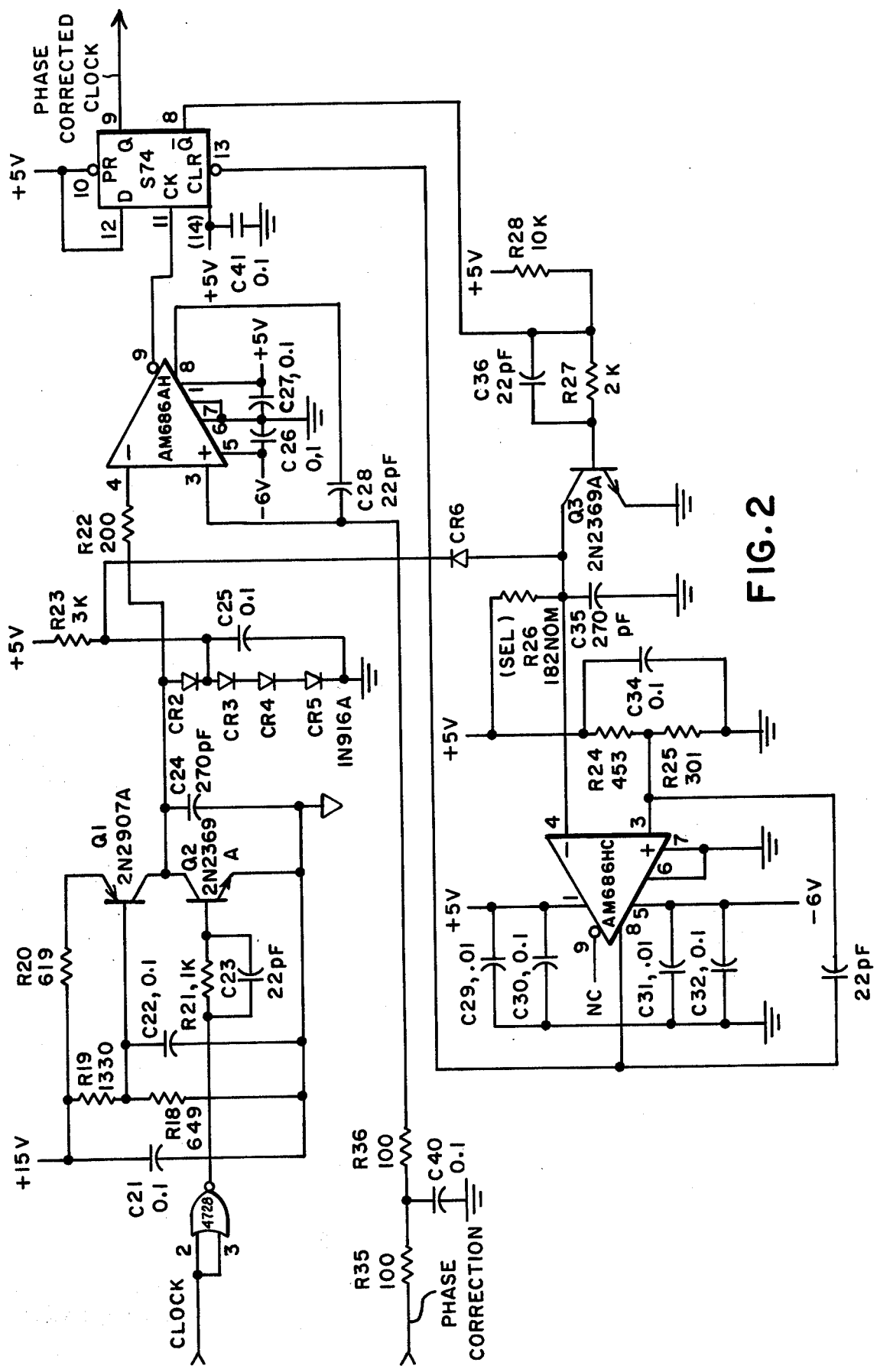
FIG. 2 shows a circuit schematic diagram of the present invention.

A fully developed circuit for use as a voltage controlled phase shifter is shown in FIG. 2 which is satisfactory for use with a CLOCK signal of approximately 12.5 megahertz presented in a $T^2L$ signal format. The duty cycle for the FIG. 2 circuit is provided by a fixed delay to result in approximately a 50% duty cycle in the PHASE CORRECTED CLOCK signal.

Current source 101 of FIG. 1A is implemented in FIG. 2 by a transistor, Q1, a capacitor, C22, and three resistors, R18, R19 and R20. Capacitor 102 in FIG. 1A as a corresponding capacitor in FIG. 2 designated C24. For the CLOCK signal shown in FIG. 1B, having approximately 50% duty cycle, capacitor C24 in FIG. 2 is allowed to charge for one half cycle of the CLOCK signal while being discharged on the other half cycle. Such a charging and discharging cycle would allow a total phase shift correction of approximately 180°. However, by extending the CLOCK signal duty cycle, the circuit of FIG. 2 can provide phase correction to nearly 360°.

Switch 100 in FIG. 1A controls the charging of capacitor 102 there. The counterpart, in FIG. 2, of switch 100 in FIG. 1A for controlling the charging of capacitor C24 in FIG. 2, is implemented by a transistor, Q2, which is driven by the CLOCK signal through a $T^2L$ NOR gate, 4728, and by a resistor, R21, in parallel with the capacitor C24. A set of diodes, CR2, CR3, CR4, and CR5, plus a capacitor, C25, provide voltage protection for a voltage comparator, AM686AH, to prevent excessive voltages from being applied thereto. This voltage comparator is a counterpart of comparator 103 in FIG. 1A.

The linearly rising voltage occurring across capacitor C24, as a result of its being charged by a current source as described above, is compared with the PHASE CORRECTION signal, provided by a source in the controlling system, by the voltage comparator AM686AH. In doing so, input filtering for the PHASE CORRECTION signal is provided by a combination of resistors, R35 and R36, along with a capacitor, C40. A resistor, R22, couples the voltage developed across capacitor C24 to the voltage comparator and serves to prevent oscillation. Some capacitors, C26, C27, and C28, are used in conjunction with the voltage comparator AM686AH for proper operation of that comparator in a well-known manner.

Voltage comparator AM686AH of FIG. 2 drives a flip-flop, S74. This flip-flop, in FIG. 2, is a counterpart of flip-flop 104 in FIG. 1A. The falling edge of the PHASE CORRECTED CLOCK signal taken from the output of flip-flop S74 in FIG. 2 is generated by clearing this flip-flop after a fixed time delay so as to generate again a 50% duty cycle in the PHASE CORRECTED CLOCK signal. This fixed time delay is, of course, on half the period of the CLOCK signal.

The time delay is implemented with another voltage comparator, AM686HC, a transistor, Q3, and the related components shown thereabout in FIG. 2. The diodes CR3, CR4 and CR5, plus capacitor C25, along with a further diode, CR6, provide voltage protection for the voltage comparator AM686HC to prevent excessive voltages from being applied thereto.

When the signal PHASE CORRECTED CLOCK shifts up to form a leading edge of a voltage pulse therein, the signal at the complementary output of flip-flop S74 falls causing transistor Q3 to turn off. This allows a capacitor, C35, to charge through a resistor, R26. The time constant of this charging of capacitor C35 provides a time delay and therefore, controls the duty cycle. The voltage across capacitor C35 is compared to a fixed reference voltage, generated by two resistors, R24 and R25. This comparison is effected by the voltage comparator AH686HC. When the voltage across capacitor C35 exceeds the fixed reference voltage so generated, this comparator has a level shift at its output which acts to clear flip-flop S74 to generate the falling edge of the PHASE CORRECTED CLOCK.

After flip-flop S74 is cleared, the complementary output of flip-flop S74 goes to the true or high logic state. This turns on transistor Q3 to discharge capacitor C35 and thereby resets the time delay circuit in FIG. 2. This clearing arrangement for flip-flop S74 requires using nothing further for timing from the CLOCK signal so that the PHASE CORRECTED CLOCK and CLOCK signals can be the same frequency.

The embodiments of the invention in which an exclusive property or right is claimed are defined as follows:

1. A controlled phase shifter having a timing signal input and a control signal input, said timing signal input adapted to receive a periodic timing signal of a selected period, said voltage controlled phase shifter comprising:

a period timing means having a period timing means output, said period timing means being capable of providing at said period timing means output, in each said selected period and in response to said periodic timing signal, a periodic phase delay signal each of which is a single-valued function of phase in its corresponding said selected period for a significant portion of that said corresponding selected period;

a comparator means having first and second comparison inputs and a comparator means output, said first comparison input connected to said period timing means output and said second comparison input serving as said control signal input, said comparator means being capable of providing a comparator means output signal level shift at said comparator means output thereof when said periodic phase delay signal sufficiently exceeds a control signal applied to said control signal input; and a duty cycle determination means having a duty cycle determination means input and a duty cycle determination means output and a duty cycle determination means input connected to said comparator means output, said duty cycle determination means being capable of providing and occurrence indication, at said duty cycle determination means output, that a said comparator means output signal level shift has occurred and being capable of providing a determination indication when a selected fraction of a said selected period has elapsed after each occurrence of said occurrence indication.

2. The apparatus of claim 1 wherein said period timing means comprises a current source means providing a substantially constant current at an output thereof, a capacitive means connected to said current source means output, and a controlled shunting switch connected across said capacitive means, with said switch opening and enclosing a circuit path around said capacitive means in response to said periodic timing signal.

3. The apparatus of claim 1 wherein said comparator means is a voltage comparator means.

4. The apparatus of claim 1 wherein said duty cycle determination means comprises a selected signal period signal storage means having said duty cycle determination means input, said duty cycle determination means output and a storage means clearing input where a signal applied thereto can clear any signal information stored in said signal storage means, and said duty cycle determination means further comprising a delay means connected between said duty cycle determination means output and said storage means clearing input.

5. The apparatus of claim 2 wherein said duty cycle determination means comprises a selected single period signal storage means having said duty cycle determination means input, said duty cycle determination means output, and a storage means clearing input where a signal applied thereto can clear any signal information stored in said signal storage means, and said duty cycle determination means further comprising a delay means connected between said duty cycle determination means output and said storage means clearing input.

6. The apparatus of claim 5 wherein said selected single period storage means is a D-type flip-flop.

7. The apparatus of claim 5 wherein said time delay means is a fixed time delay means.

8. The apparatus of claim 5 wherein said time delay means comprises an automatic feedback control loop.

9. The apparatus of claim 5 wherein said comparator means is a voltage comparator means.

* * * * *